(12) United States Patent
Churchill

(10) Patent No.: US 6,724,232 B1
(45) Date of Patent: *Apr. 20, 2004

(54) DUAL TRISTATE PATH OUTPUT BUFFER CONTROL

(75) Inventor: Jonathan F. Churchill, Reading (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/353,375

(22) Filed: Jan. 29, 2003

Related U.S. Application Data

(63) Continuation of application No. 09/997,130, filed on Nov. 29, 2001, now Pat. No. 6,538,485.

(51) Int. Cl.[7] .............................. H03K 3/013; G06F 1/04
(52) U.S. Cl. ....................................... 327/292; 327/294
(58) Field of Search ................................ 327/108, 161, 327/166, 170, 176, 185, 263, 277, 292–294, 298; 326/56

(56) References Cited

U.S. PATENT DOCUMENTS

| | | | | |
|---|---|---|---|---|
| 5,239,215 A | | 8/1993 | Yamaguchi | 326/101 |
| 5,625,311 A | | 4/1997 | Nakatsu | 326/93 |
| 5,999,023 A | | 12/1999 | Kim | 327/144 |
| 6,269,451 B1 | | 7/2001 | Mullarkey | 713/401 |
| 6,529,033 B1 | * | 3/2003 | Park et al. | 326/16 |

* cited by examiner

*Primary Examiner*—My-Trang Nu Ton
(74) *Attorney, Agent, or Firm*—Christopher P. Maiorana, P.C.

(57) ABSTRACT

An apparatus comprising a first circuit and a second circuit. The first circuit may be configured to generate one or more first control signals in response to (i) a clock signal and (ii) one or more second control signals. The second circuit may be (i) coupled to the first circuit via one or more path circuits and (ii) configured to present an output signal in response to the one or more first control signals. All of the one or more first control signals may have a preferred edge skew.

22 Claims, 5 Drawing Sheets

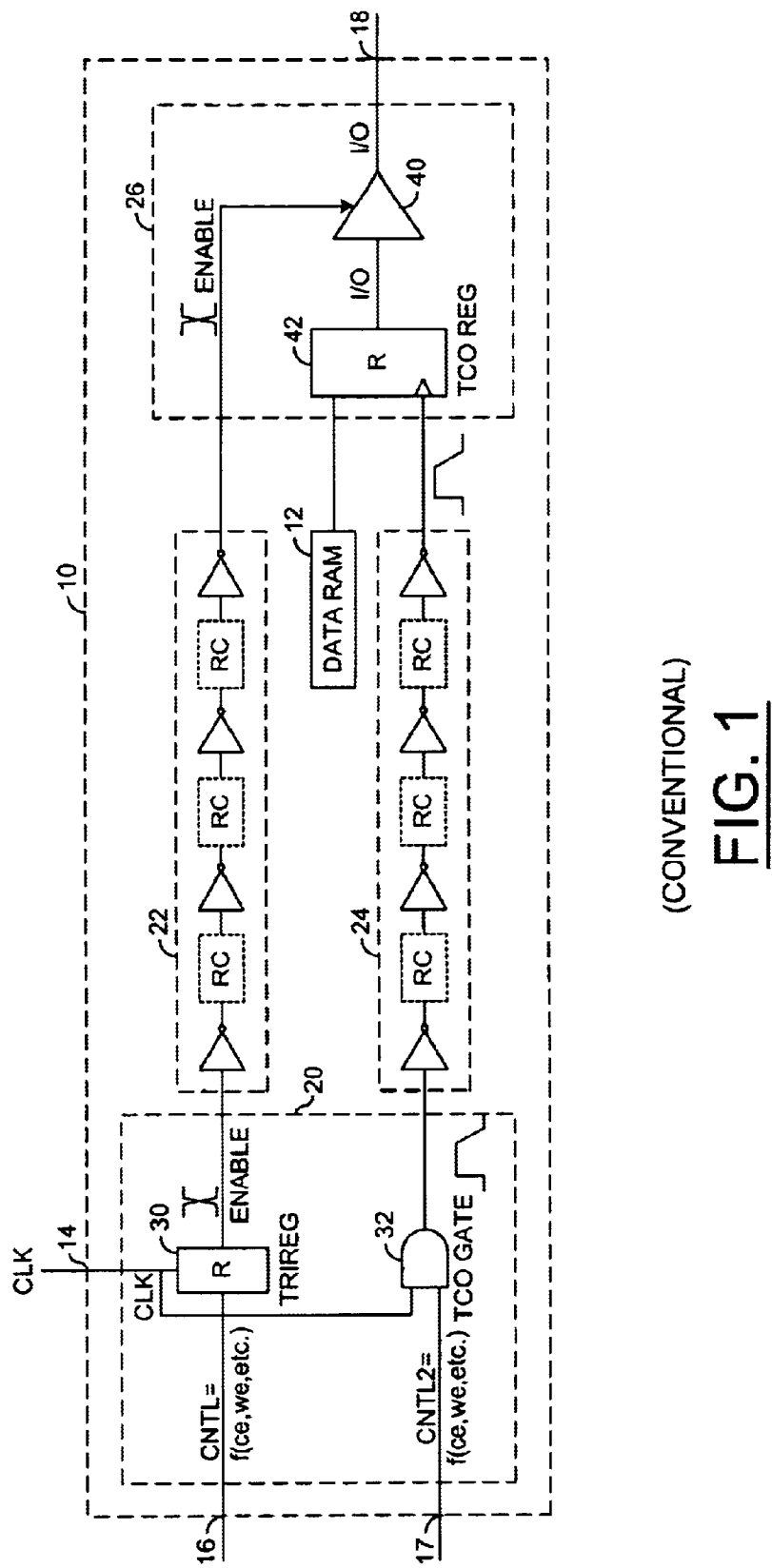
FIG. 1
(CONVENTIONAL)

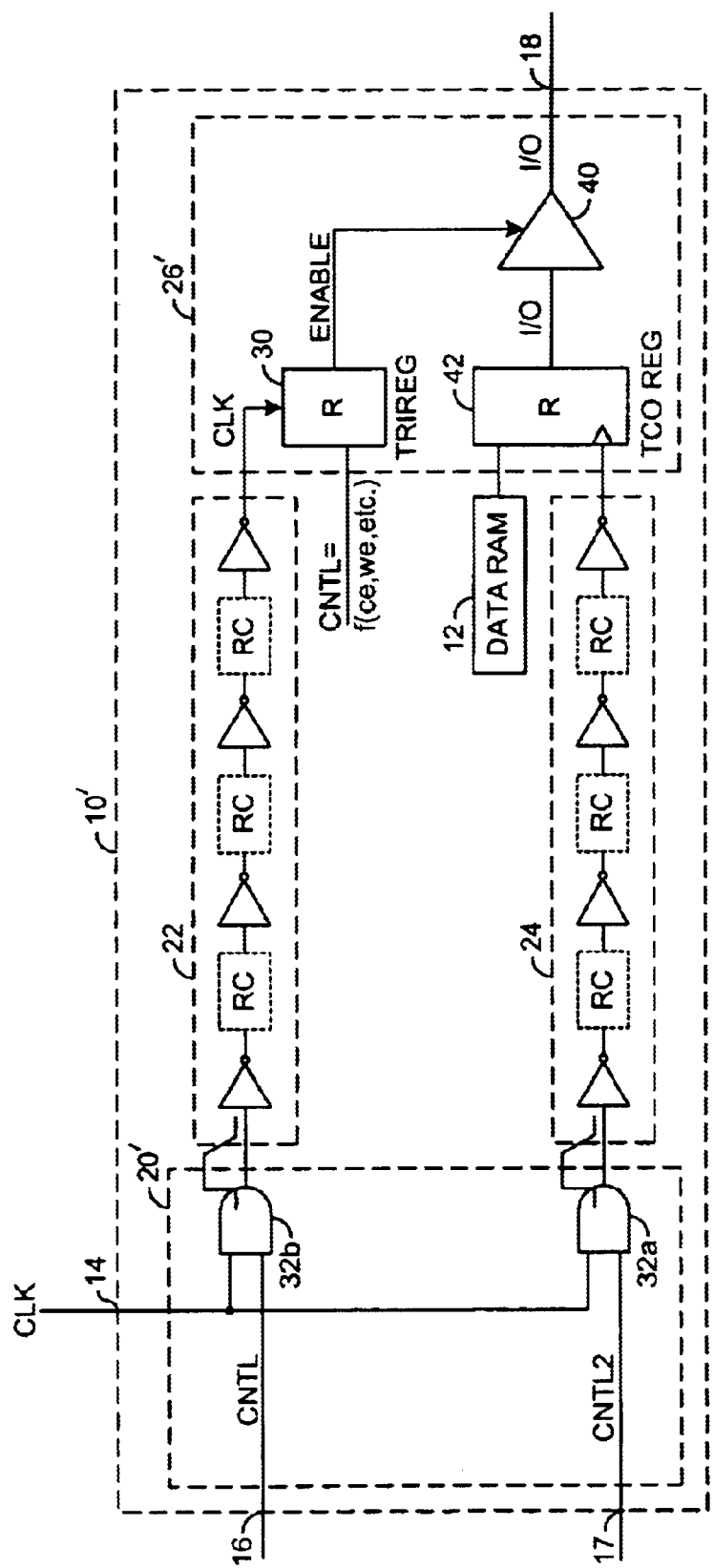
FIG. 2
(CONVENTIONAL)

DUAL TRISTATE PATH OUTPUT BUFFER CONTROL

This is a continuation of U.S. Ser. No. 09/997,130 filed Nov. 29, 2001 now U.S. Pat. No. 6,538,485.

FIELD OF THE INVENTION

The present invention relates to a method and/or architecture for implementing output buffer control generally and, more particularly, to a method and/or architecture for implementing a dual tristate path output buffer control.

BACKGROUND OF THE INVENTION

Synchronous random access memories (RAMs) use clock signals to control (enable/disable) output buffers. Conventional synchronous RAMs have maximum time delay specifications for the propagation of the clock signal to the output buffer when the output buffer control circuit (i.e., a tristate register) is in a low impedance state (i.e., Tclz) and when the output buffer control circuit is in a high impedance state (i.e., Tchz). The Tclz and Tchz parameters often have the same time delay specification as a clock control circuit to valid output timing specification when the RAM is in a pipelined mode (i.e., Tco).

Referring to FIG. 1, a block diagram illustrating a conventional clock signal to output buffer control circuit 10 is shown. The circuit 10 is coupled to a RAM 12. The circuit 10 can be common to all RAM outputs. The circuit 10 has an input 14 that receives a clock signal (i.e., CLK), an input 16 that receives a first control signal (i.e., CNTL), an input 17 that receives a second control signal (i.e., CNTL2), and an output 18 that presents a signal (i.e., IO). The signal ENABLE is the RAM 12 output enable/disable signal. The signal CNTL controls the signal ENABLE in response to (i.e., as a function of) signals such as chip enable, write enable, etc. The signal IO is the memory output signal. The signal ENABLE only changes on the rising edge of the signal CLK if the signal CTRL has changed since the previous rising edge of the signal CLK.

The circuit 10 includes a controller 20, a Tclz/Tchz path circuit 22, a Tco path circuit 24, and an output buffer 26. The controller 20 is often implemented at the physical center of the RAM 12. The controller 20 is coupled to the output buffer 26 via the paths 22 and 24. The controller 20 is typically implemented as a tristate register 30 and a Tco gate 32. The Tco gate 32 is typically implemented as an AND gate. The register 30 controls the enabled/disabled state of the output buffer 26 in response to the signals CLK and CNTL. The paths 22 and 24 include a number of amplifiers/buffers (or inverting amplifiers/buffers) and RC elements (i.e., metal interconnect parasitic delays). The output buffer 26 includes a buffer circuit 40 and a Tco register 42. The buffer 40 has a data input that receives the signal IO, an enable input that receives the signal ENABLE, and an output that presents the signal IO.

The register 30 has inputs that receive the signals CLK and CNTL and an output that presents the signal ENABLE to the Tclz/Tchz path 22. The Tco gate 32 has an input that receives the signal CLK, an input that receives the signal CNTL2 and an output that presents the signal CLK to the Tco propagation path 24. When the circuit 10 is operated in the pipeline mode, the path 24 presents the signal CLK to a clock input of the Tco register 42. The Tco register 42 presents the signal IO to the buffer 40.

The LOW to HIGH (i.e., enable) and HIGH to LOW (i.e., disable) edges of the signal ENABLE corresponding to the Tclz and Tchz parameters, respectively, need to propagate through the circuit 10 with equal speed and priority. However, the Tco parameter path 24 only has to propagate the rising (LOW to HIGH) edge of the output register clock signal CLK to the output buffer 26 from the central control logic 20. The Tco parameter rising edge logic is skewed to favor the clock signal CLK rising edge. However, the Tclz/Tchz parameter path 22 cannot favor either the rising or the trailing edge of the signal ENABLE. As a result, the Tco parameter path 24 is faster than the Tclz/Tchz parameter path 22. Propagation of the HIGH to LOW and LOW to HIGH edges of the signal ENABLE at different speeds can cause delay imbalance in the buffer 40 between the Tco parameter and the Tclz/Tchz parameters.

Referring to FIG. 2, a block diagram illustrating another conventional buffer control circuit 10' is shown. The circuit 10' represents a previous attempt to resolve the delay imbalance in the buffer 40. The circuit 10' is implemented similarly to the circuit 10. The circuit 10' includes the paths 22 and 24, a controller 20' (i.e., the Tco gate 32a and a clock gate 32b), and an output buffer circuit 26'. Each of the circuits 26' in the RAM includes the tristate register circuit 30 as well as the buffer 40 and the Tco register 42. However, the register 30 requires time to setup (i.e., Tsetup) and to hold (i.e., Thold). The times Tsetup and Thold delay and/or skew the timing of the signal CLK. As a result, the circuit 10' fails to provide an adequate solution to the delay imbalance in the buffer 40.

It would be desirable to have an output buffer control circuit that (i) matches the timing of the enable/disable signals to a preferred path timing, (ii) presents the buffer control signal at high and low logic states with substantially equal timing, (iii) reduces or eliminates buffer delay imbalance, and/or (iv) reduces or eliminates setup and hold timing issues.

SUMMARY OF THE INVENTION

The present invention concerns an apparatus comprising a first circuit and a second circuit. The first circuit may be configured to generate one or more first control signals in response to (i) a clock signal and (ii) one or more second control signals. The second circuit may be (i) coupled to the first circuit via one or more path circuits and (ii) configured to present an output signal in response to the one or more first control signals. All of the one or more first control signals may have a preferred edge skew.

The objects, features and advantages of the present invention include providing a method and/or architecture for implementing a dual tristate path output buffer control that may (i) match the timing of the enable/disable signals to a preferred path, (ii) provide substantially equal timing when the buffer control signal is at high and low logic states, (iii) reduce or eliminate buffer delay imbalance, (iv) reduce or eliminate setup and hold timing issues, and/or (v) provide substantially equal output buffer assertion/de-assertion timing.

BRIEF DESCRIPTION OF THE DRAWINGS

These and other objects, features and advantages of the present invention will be apparent from the following detailed description and the appended claims and drawings in which:

FIG. 1 is a block diagram of a conventional buffer control circuit;

FIG. 2 is a block diagram of another conventional buffer control circuit;

DETAILED DESCRIPTION OF THE PREFERRED EMBODIMENTS

Figure 3:
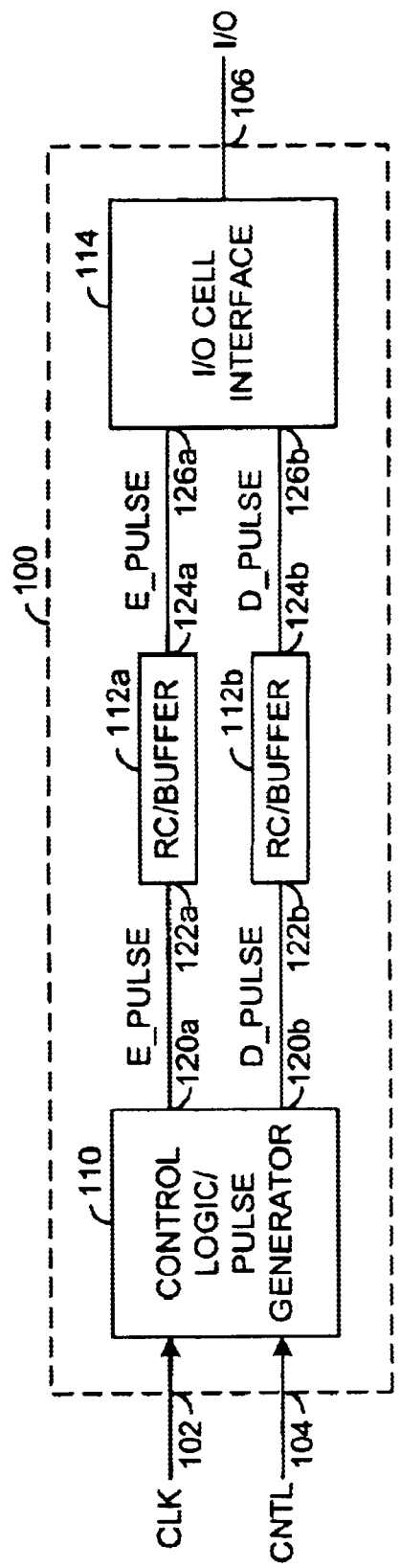
FIG. 3 is a block diagram of a preferred embodiment of the present invention.

Referring to FIG. 3, a block diagram illustrating a circuit 100 is shown in accordance with a preferred embodiment of the present invention. The circuit 100 may be a dual tristate path output buffer control circuit. The circuit 100 is generally implemented internal to a random access memory (RAM) circuit (described in connection with FIG. 5). The circuit 100 may have an input 102 that may receive a signal (e.g., CLK), an input 104 that may receive a signal (e.g., CNTL), and an output 106 that may present a signal (e.g., IO). The signal CLK may be a memory clock signal. The signal CNTL may be a control signal. The signal CNTL may be asserted in response to one or more external and/or internal control function signals (e.g., chip enable, write enable, etc.). The signal IO may be a memory output signal that may be presented to the circuit 100 by a memory cell in the RAM. The circuit 100 may be configured to present the signal IO in response to the signals CLK and CNTL.

The circuit 100 generally comprises a circuit 110, one or more circuits 112 (e.g., circuits 112a and 112b), and a circuit 114. The circuit 110 may be implemented as a buffer control logic/pulse generator circuit. The circuits 112a and 112b are generally path circuits. The circuit 114 may be implemented as an input/output memory cell interface circuit. The circuit 114 may be, in one example, an output buffer circuit. The circuit 114 is generally coupled to a RAM memory cell/sense amplifier (described in connection with FIGS. 4 and 5). The circuit 110 may be coupled to the circuit 114 via the circuits 112.

The circuit 110 may have an input that may receive the signal CLK, an input that may receive the signal CNTL, and one or more outputs (e.g., an output 120a and an output 120b) that may present one or more signals (e.g., E_PULSE and D_PULSE, respectively). The signals E_PULSE and D_PULSE may be logic signals. The signals E_PULSE and D_PULSE may be control signals. The signals E_PULSE and D_PULSE may be pulses. The circuit 110 may be configured to generate the signals E_PULSE and D_PULSE in response to the signals CLK and CNTL. The circuit 114 may be enabled and disabled in response to the signals E_PULSE and D_PULSE, respectively, The signal IO may be presented when the circuit 114 is enabled.

The circuit 112a may have an input 122a that may receive the signal E_PULSE and an output 124a that may present the signal E_PULSE. The circuit 112b may have an input 122b that may receive the signal D_PULSE and an output 124b that may present the signal D_PULSE. The circuit 114 may have an input 126a that may receive the signal E_PULSE, an input 126b that may receive the signal D_PULSE, and an output that may present the signal IO. The circuits 112a and 112b generally provide parasitic delays to the signals E_PULSE and D_PULSE, respectively. The circuits 112a and 112b generally comprise a dual path for the enable/disable signals E_PULSE and D_PULSE.

Figure 4:
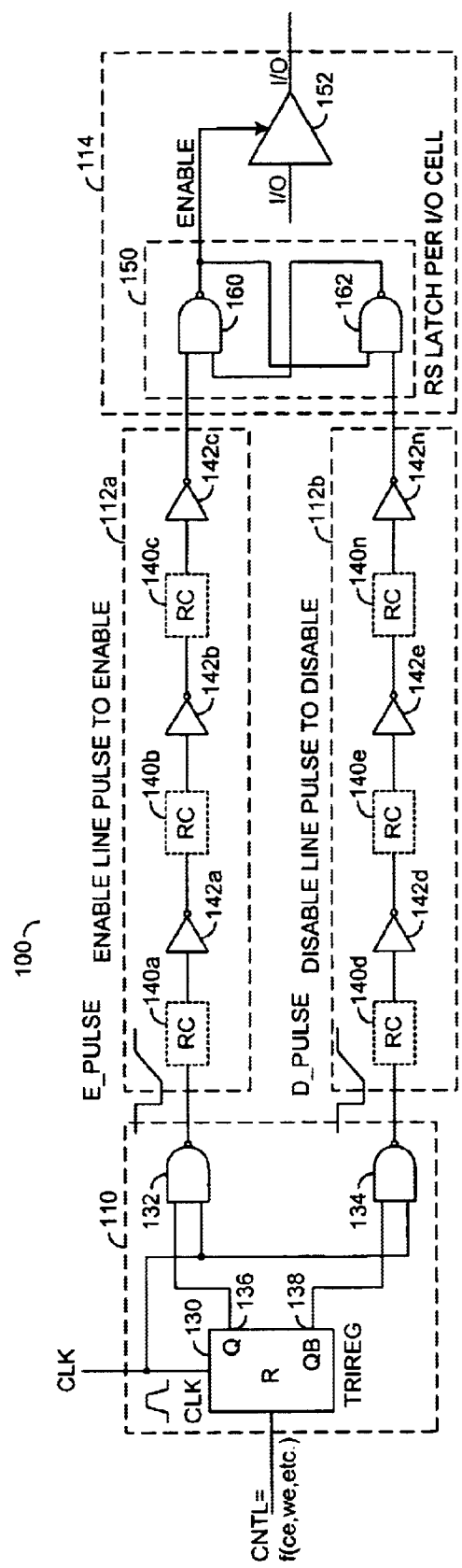
FIG. 4 is a detailed block diagram of the circuit of FIG. 3.

Referring to FIG. 4, a detailed block diagram illustrating the circuit 100 is shown. The circuit 110 generally comprises a circuit (or device) 130 and a number of devices (e.g., a device 132 and a device 134). The circuit 130 may be implemented as a register. In one example, the circuit 130 may be implemented as a tristate register. However, any appropriate register circuit may be implemented accordingly to meet the design criteria of a particular application. The devices 132 and 134 may be implemented as logic gates. In one example, the devices 132 and 134 may be implemented as NAND gates. However, any appropriate logic gates may be implemented accordingly to meet the design criteria of a particular application.

The circuit 130 may have an input that may receive the signal CLK, an input that may receive the signal CNTL, an output 136 that may present a signal (e.g., Q), and an output 138 that may present a signal (e.g., Qb). The signal Q may be a registered version of the signal CLK. The signal Qb is generally the digital complement (e.g., inverse) of the signal Q. The signals Q and Qb are generally intermediate signals. The circuit 130 may be configured to generate the signals Q and Qb in response to the signals CLK and CNTL.

The device 132 may have an input that may receive the signal CLK, an input that may receive the signal Q, and an output that may present the signal E_PULSE. The device 134 may have an input that may receive the signal CLK, an input that may receive the signal Qb, and an output that may present the signal D_PULSE.

The signal CLK is generally symmetric (e.g., the rising edge and the falling edge of the signal clock may have similar timing). The signals E_PULSE and D_PULSE may be skewed. The signals E_PULSE and D_PULSE may have faster leading edges than trailing edges. The circuit 100 may be configured such that the leading edge of the signals E_PULSE and D_PULSE propagate more rapidly through the circuit 100 than a conventional clock signal propagates through a conventional buffer control circuit such as the circuits 10 and 10'. In one example, the circuit 100 may be configured such that the leading edge skew for the signals E_PULSE and D_PULSE matches the skew of a timing signal for a valid output of the RAM in a pipelined mode of operation of circuit 28 shown in FIG. 1 (e.g., the timing signal corresponding to a time Tco). The timing specification Tco may be a preferred (e.g., maximum, optimum, etc.) timing.

In another example (e.g., when the pipelined mode timing signal is implemented with a trailing edge preferred timing skew), the circuit 100 may be configured such that the trailing edge skew for the signals E_PULSE and D_PULSE matches skew of the timing signal corresponding to the timing specification Tco. The signals E_PULSE and D_PULSE may be skewed to propagate more rapidly than the buffer control clocking signals in conventional buffer circuits.

In one example, the circuit 110 may be configured to generate the signals E_PULSE and D_PULSE with a reverse polarity when compared to the signal CLK (e.g., the signals E_PULSE and D_PULSE may transition HIGH to LOW when the signal CLK transitions LOW to HIGH and vice versa). However, the signals E_PULSE and D_PULSE may be generated with the same polarity as the signal CLK.

The circuit 112 generally comprises a number of delays 140 (e.g., 140a–140n) and a number of devices 142 (e.g., 142a–142n). The delays 140 generally comprise metal interconnect parasitic delays. The devices 142 may be implemented as inverting amplifiers/buffers (e.g., inverters/buffers) configured to buffer the parasitic wiring delays 140. The circuits 142 are generally serially coupled to the delays 140. The circuit 112a and the circuit 112b may be configured to have substantially equal signal propagation characteristics (e.g., delay time, filtering, skew, etc.). The signal propagation characteristics of the circuit 112 may be configured to be substantially equal to the signal propagation characteristics of the pipelined mode path timing signal.

The circuit 114 generally comprises a circuit 150 and a circuit 152. The circuit 150 may be implemented as a latch circuit. In one example, the circuit 150 may be implemented as an RS latch circuit. However, any appropriate latch circuit may be implemented accordingly to meet the design criteria of a particular application. The circuit 152 may be implemented as a buffer circuit.

The circuit 150 may have an input that may receive the signal E_PULSE, and input that may receive the signal D_PULSE, and an output that may present a signal (e.g., ENABLE). The signal ENABLE may be a control signal. The circuit 150 may be configured to generate the signal ENABLE in response to the signals E_PULSE and D_PULSE. The circuit 152 may have an input that may receive the signal IO, an enable input that may receive the signal ENABLE, and an output that may present the signal IO. The circuit 152 may be configured to present the signal IO in response to the signal ENABLE.

In one example, the circuit 150 comprises a device 160 and a device 162. The devices 160 and 162 may be implemented as cross-coupled NAND gates (e.g., the device 160 may have an output coupled to a first input of the device 162 and the device 162 may have an output coupled to a first input of the device 160). The device 160 may have a second input that may receive the signal E_PULSE and the output of the device 160 may present the signal ENABLE. The device 162 may have a second input that may receive the signal D_PULSE. However, any appropriate latch circuit configuration may be implemented accordingly to meet the design criteria of a particular application.

When the circuit 100 is powered up, the circuit 110 may be configured to present the signal E_PULSE and/or D_PULSE to the circuit 114 via the circuits 112 such that the latch circuit 150 is in a known state (e.g., such that the signal ENABLE may be de-asserted and the circuit 152 may be disabled or, alternatively, the signal ENABLE may be asserted and the circuit 152 may be enabled). In one example, on all succeeding cycles of the signal CLK after power up, the signal E_PULSE may be presented by the circuit 110 when the circuit 152 is to be enabled (e.g., the signal IO is to be presented by the circuit 100) and the signal D_PULSE may be presented by the circuit 110 when the circuit 152 is to be disabled (e.g., the signal IO is not presented). The pulse signals E_PULSE and D_PULSE may be skewed such that the leading pulse edge propagates rapidly when compared to a conventional buffer control circuit. The pulse signals E_PULSE and D_PULSE may either flip the latch circuit 150 or reconfirm the latch circuit 150 state.

In another example, the circuit 100 may be configured to present the signal E_PULSE or the signal D_PULSE only when the output buffer 114 is to change state rather the in on every cycle of the clock signal CLK. Presenting the signals E_PULSE and D_PULSE only when the circuit 114 is to change state may reduce power consumption of the circuit 100.

While the present invention has been described in connection with an output buffer, the present invention may be implemented in any buffer control configuration where timing signal balancing and path timing matching may be advantageous (e.g., input buffer control, etc.).

Figure 5:
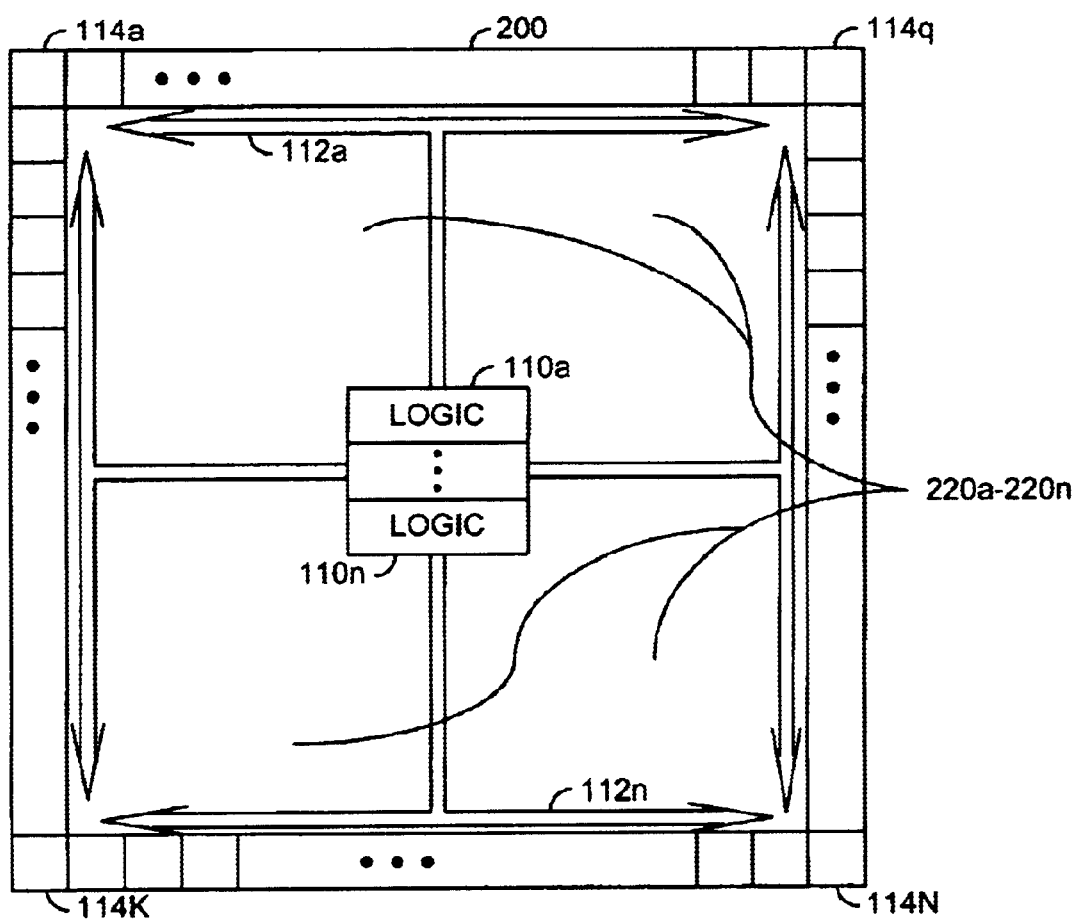
FIG. 5 is a block diagram of an implementation of the circuit of FIG. 3 in a memory.

Referring to FIG. 5, a block diagram illustrating a memory circuit 200 is shown. The circuit 200 may be implemented as a random access memory (RAM) having an implementation of the circuit 100 (e.g., circuits 100a–100n). The circuit 200 generally comprises the circuits 100a–100n coupled to a plurality of memory cells with sense amplifiers (e.g., an array) 202a–202n. The circuit 200 may be implemented with one or more circuits 110. In one example, a single circuit 110 may be common to the circuits 100a–100n. However, any appropriate number of the circuits 110a–110n may be implemented accordingly to meet the design criteria of a particular application. The control circuits 110a–110n may be positioned centrally in the array 202. The buffer circuits 114a–114n are generally positioned at the input and output peripheries of the array 202. The circuits 100a–100n are generally configured to control the input/output functions (e.g., the signal IO) of the circuit 200. Positioning the control circuit 110 at the center of the RAM 200 array may improve the input/output buffer (e.g., the circuit 114) timing signal balance and path timing matching.

The present invention may present the enable/disable signals E_PULSE and D_PULSE with one edge (e.g., either the leading edge or the trailing edge) skewed. The signals E_PULSE and D_PULSE may match the Tco (e.g., the preferred) path speed. The present invention may reduce and/or eliminate output buffer setup time (e.g., Tsetup) and hold time (e.g., Thold) issues found in some conventional buffer control circuits. The present invention may have substantially equal output buffer control signal assertion and de-assertion propagation times (e.g., the propagation time for the signals E_PULSE and D_PULSE via the dual path circuits 112a and 112b, respectively, may be substantially equal). The output buffer control signal assertion and de-assertion time delays may be balanced. The output buffer control signal assertion/de-assertion times for the present invention may only depend on one of (i) a HIGH to LOW, (ii) a LOW to HIGH, or (iii) a rail to rail transition of the signals E_PULSE and D_PULSE. However, any appropriate one or more logic signal transitions may be implemented accordingly to meet the design criteria of a particular application.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate two or more first control signals in response to (i) a clock signal and (ii) one or more second control signals; and
    a second circuit (i) coupled to said first circuit via one or more path circuits and (ii) configured to present an output signal in response to said two or more first control signals, wherein all of said two or more first control signals have a preferred edge skew.

2. The apparatus according to claim 1, wherein said first circuit comprises a tristate register configured to (i) receive said clock signal and said one or more second control signals and (ii) present one or more intermediate signals to a number of logic gates, wherein said logic gates are configured to generate said two or more first control signals in response to said clock signal and said one or more intermediate signals.

3. The apparatus according to claim 1, wherein said second circuit comprises (i) a latch circuit configured to (a) receive said two or more first control signals and (b) generate a third control signal and (ii) a buffer circuit configured to present said output signal in response to said third control signal.

4. The apparatus according to claim 1, wherein said preferred edge skew comprises a pipelined mode timing control signal edge skew.

5. The apparatus according to claim 1, further comprising (i) a random access memory (RAM) comprising an array of a plurality of memory cells, (ii) one or more of said first circuits, and (iii) a plurality of said second circuits, wherein each of said memory cells has (a) one of said plurality of second circuits coupled to an input and (b) another of said plurality of second circuits coupled to an output.

6. The apparatus according to claim 5, wherein said one or more first circuits are positioned centrally in said array and said plurality of said second circuits are positioned at a periphery of said RAM.

7. The apparatus according to claim 1, wherein all of said one or more path circuits have substantially equal signal propagation characteristics.

8. The apparatus according to claim 1, wherein at least one of said first control signals is an enable signal and at least another of said first control signals is a disable signal.

9. The apparatus according to claim 8, wherein said apparatus is configured to balance a propagation time of said enable signal and a propagation time of said disable signal.

10. The apparatus according to claim 1, wherein said skew is on a leading edge of said two or more first control signals.

11. The apparatus according to claim 1, wherein said skew is on a trailing edge of said two or more first control signals.

12. The apparatus according to claim 1, wherein one of said first control signals is presented at each cycle of said clock signal.

13. The apparatus according to claim 1, wherein said two or more first control signals are presented only when said second circuit is to change state such that power consumption of said apparatus is reduced.

14. The apparatus according to claim 1, wherein propagation times of said two or more first control signals depends on a transition of one or more logic signals.

15. The apparatus according to claim 1, wherein all of said two or more first control signals have substantially equal timing.

16. The apparatus according to claim 1, wherein said first circuit comprises a tristate register configured to generate said two or more control signals in response to said clock signal and said one or more second control signals.

17. An apparatus for controlling buffer circuits comprising:
    means for generating two or more first control signals in response to (i) a clock signal and (ii) one or more second control signals; and
    means for generating an output signal in response to said one two or more first control signals, wherein all of said two or more first control signals have a preferred edge skew.

18. A method for controlling buffer circuits comprising the steps of:
    (A) generating two or more first control signals in response to (i) a clock signal and (ii) one or more second control signals; and
    (B) generating an output signal in response to said two or more first control signals, wherein all of said two or more first control signals have a preferred edge skew.

19. The method according to claim 18, further comprising the step of transmitting said two or more first control signals via one or more path circuits, wherein all of said path circuits are configured to have substantially equal propagation characteristics.

20. The method according to claim 18, wherein said preferred edge skew comprises a pipelined mode timing control signal edge skew.

21. The method according to claim 19, wherein said method further comprises the steps of:
    generating said two or more first control signals centrally in a random access memory (RAM) array; and
    generating said output signal at a periphery of said RAM.

22. The method according to claim 19, wherein said method further comprises the step of balancing a propagation time of said two or more first control signals.

* * * * *